(12) United States Patent
Chen (10) Patent No.: US 11,525,703 B2
(45) Date of Patent: Dec. 13, 2022

(54) INTEGRATED CAPACITOR AND ANTENNA

(71) Applicant: BOSE CORPORATION, Framingham, MA (US)

(72) Inventor: Louis Chen, Bolton, MA (US)

(73) Assignee: BOSE CORPORATION, Framingham, MA (US)

( * ) Notice: Subject to any disclaimer, the term of this patent is extended or adjusted under 35 U.S.C. 154(b) by 358 days.

(21) Appl. No.: 16/806,801

(22) Filed: Mar. 2, 2020

(65) Prior Publication Data
US 2021/0270639 A1 Sep. 2, 2021

(51) Int. Cl.
*G01D 5/24* (2006.01)
*G06F 3/16* (2006.01)
*H01Q 1/27* (2006.01)
*H04R 1/10* (2006.01)
*H03K 17/96* (2006.01)

(52) U.S. Cl.
CPC ........... *G01D 5/2405* (2013.01); *G06F 3/165* (2013.01); *H01Q 1/273* (2013.01)

(58) Field of Classification Search
None
See application file for complete search history.

(56) References Cited

U.S. PATENT DOCUMENTS

| | | |
|---|---|---|
| 4,366,483 A | 12/1982 | Hagedon et al. |
| 5,220,340 A | 6/1993 | Shafai |
| 6,646,621 B1 | 11/2003 | Phelan et al. |
| 6,750,828 B1 | 6/2004 | Wixforth et al. |
| 7,075,500 B2 | 7/2006 | Carbonari |
| 7,652,628 B2 | 1/2010 | Zweers |
| 8,797,230 B2 | 8/2014 | Leisten |
| 9,065,176 B2 | 6/2015 | Wang |
| 10,944,157 B2 | 3/2021 | Chen |
| 2004/0108966 A1 | 6/2004 | McKivergan et al. |
| 2005/0266875 A1 | 12/2005 | Yegin et al. |
| 2011/0298482 A1* | 12/2011 | Tokudome ........... H03K 17/962 324/686 |
| 2014/0266975 A1 | 9/2014 | Grbic et al. |
| 2016/0077639 A1* | 3/2016 | Leek ........................ G01D 5/24 324/630 |
| 2017/0102802 A1* | 4/2017 | Standing .............. H03K 17/955 |
| 2018/0077484 A1 | 3/2018 | Yeung et al. |

(Continued)

FOREIGN PATENT DOCUMENTS

EP 1833116 A2 9/2007

OTHER PUBLICATIONS

Best, Steven R., "Low Q Electrically Small Linear and Elliptical Polarized Spherical Dipole Antennas", IEEE Transactions on Antennas and Propagation, vol. 53, No. 3, pp. 1047-1053 (Mar. 2005).

(Continued)

*Primary Examiner* — Qin Zhu
(74) *Attorney, Agent, or Firm* — Lando & Anastasi, LLP (57) ABSTRACT

According to one example of the disclosure, a device comprises an antenna, a capacitor including a first plate having a first voltage, and the antenna having a second voltage, and sensing circuitry coupled to the first plate and configured to apply the first voltage to the first plate, determine a capacitance between the first plate and the antenna, and identify, based on the capacitance, a capacitive touch input.

19 Claims, 8 Drawing Sheets

(56) References Cited

U.S. PATENT DOCUMENTS

| | | |
|---|---|---|
| 2018/0166776 A1 | 6/2018 | Ziegler et al. |
| 2018/0217190 A1* | 8/2018 | Spevak ............... G01D 5/2405 |
| 2020/0186179 A1* | 6/2020 | Horiuchi .............. G06F 3/0447 |
| 2020/0335855 A1 | 10/2020 | Chen |

OTHER PUBLICATIONS

Best, Steven R., "The Radiation Properties of Electrically Small Folded Spherical Helix Antennas", IEEE Transactions on Antennas and Propagation, vol. 52, No. 4, pp. 953-960 (Apr. 2004).

McLean, James S., "A Re-Examination of the Fundamental Limits on the Radiation Q of Electrically Small Antennas", IEEE Transactions on Antennas and Propagation, vol. 44, No. 5, pp. 672-676 (May 1996).

* cited by examiner

INTEGRATED CAPACITOR AND ANTENNA

BACKGROUND

1. Field of the Disclosure

At least one example in accordance with the present disclosure relates generally to capacitive sensing.

2. Discussion of Related Art

Capacitive touch sensors detect changes in capacitance between two or more capacitor plates. A first plate is connected to a power source, and a second plate is connected to a reference node (for example, a ground node). A signal is applied to the first plate to generate an electrical field between the first plate and the second plate. A capacitance between the first plate and the second plate may be determined by analyzing one or more electrical parameters related to the capacitance, such as a voltage of the first plate, a current applied to the first plate, and so forth. Changes in capacitance may be detected and identified as user inputs where, for example, a change in capacitance is consistent with the effect of a human body being at or near the capacitive touch sensor within an electrical field between the plates.

SUMMARY

According to at least one aspect of the present disclosure, a device is provided comprising an antenna, a capacitor including a first plate having a first voltage, and the antenna having a second voltage, and sensing circuitry coupled to the first plate and configured to apply the first voltage to the first plate, determine a capacitance between the first plate and the antenna, and identify, based on the capacitance, a capacitive touch input.

In various examples, the second voltage is a ground reference. In at least one example, the capacitor consists of the first plate and the antenna. In some examples, the antenna is implemented around a perimeter the first plate. In various examples, the antenna is substantially symmetrical around the first plate. In at least one example, the device further comprises an enclosure having an outer surface and an inner surface and including the sensing circuitry, wherein the first plate and the antenna are formed on the outer surface of the enclosure. In at least one example, the first plate is coupled to the inner surface of the enclosure by at least one via through the enclosure.

In various examples, the at least one via is coupled to the sensing circuitry by a trace on the inner surface of the enclosure. In some examples, the sensing circuitry includes a printed circuit board (PCB), and wherein the trace is coupled to the PCB by a pogo pin between the trace and the PCB. In various examples, the sensing circuitry is further configured to sense at least one of the first voltage and a current applied to the first plate, and wherein determining, by the sensing circuitry, the capacitance between the first plate and the antenna is based on the at least one of the first voltage and the current applied to the first plate. In some examples, the capacitor further includes a second plate having a third voltage, and wherein the sensing circuitry is further configured to apply the third voltage to the second plate, determine a change in a mutual capacitance between the first plate and the second plate, and identify, based on the change in the mutual capacitance, the capacitive touch input.

According to another aspect of the disclosure, a method of operating a device including an antenna and a capacitor including a first plate and the antenna is provided, the method comprising applying a first voltage to the first plate, generating an electrical field between the first plate and the antenna based on the first voltage, determining at least one electrical parameter indicative of a capacitance between the first plate and the antenna based on the electrical field, and identifying, based on the at least one electrical parameter, a capacitive touch input.

In various examples, determining the at least one electrical parameter includes sensing at least one of the first voltage and a current applied to the first plate. In at least one example, the method further comprises determining, based on the at least one electrical parameter, the capacitance between the first plate and the antenna, wherein identifying the capacitive touch input includes detecting a change in the capacitance between the first plate and the antenna. In some examples, the capacitor further includes a second plate, the method further comprising applying a second voltage to the second plate, generating an electrical field between the first plate and the second plate based on the second voltage, determining at least one electrical parameter indicative of a change in a mutual capacitance between the first plate and the second plate based on the electrical field, and identifying, based on the at least one electrical parameter indicative of the change in the mutual capacitance, the capacitive touch input. In various examples, identifying the capacitive touch input includes detecting a change in the at least one electrical parameter indicative of a change in the capacitance between the first plate and the antenna.

According to another aspect of the disclosure, a non-transitory computer-readable medium storing thereon sequences of computer-executable instructions for operating a device including an antenna and a capacitor comprising a first plate and an antenna is provided, the sequences of computer-executable instructions including instructions that instruct at least one processor to apply a first voltage to the first plate, generate an electrical field between the first plate and the antenna based on the first voltage, determine at least one electrical parameter indicative of a capacitance between the first plate and the antenna based on the electrical field, and identify, based on the at least one electrical parameter, a capacitive touch input.

In various examples, determining the at least one electrical parameter includes sensing at least one of the first voltage and a current applied to the first plate, and wherein the instructions further instruct the at least one processor to determine, based on the at least one electrical parameter, the capacitance between the first plate and the antenna. In at least one example, identifying the capacitive touch input includes at least one of detecting a change in the capacitance between the first plate and the antenna and detecting a change in the at least one electrical parameter indicative of a change in the capacitance between the first plate and the antenna. In some examples, the device further includes a second plate, and wherein the instructions further instruct the at least one processor to apply a second voltage to the second plate, generate an electrical field between the first plate and the second plate based on the second voltage, determine at least one electrical parameter indicative of a change in a mutual capacitance between the first plate and the second plate based on the electrical field, and identify, based on the at least one electrical parameter indicative of the change in the mutual capacitance, the capacitive touch input.

BRIEF DESCRIPTION OF THE DRAWINGS

Various aspects of at least one example are discussed below with reference to the accompanying figures, which are not intended to be drawn to scale. The figures are included to provide an illustration and a further understanding of the various aspects and examples, and are incorporated in and constitute a part of this specification, but are not intended as a definition of the limits of any particular example. The drawings, together with the remainder of the specification, serve to explain principles and operations of the described and claimed aspects and examples. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other examples and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, components, elements or acts of the systems and methods herein referred to in the singular may also embrace examples including a plurality, and any references in plural to any example, component, element or act herein may also embrace examples including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Capacitive touch sensors may be implemented in various electronic devices to provide a user input interface. For example, capacitive touch sensors may be implemented in audio devices, such as headphones or earphones. An audio device may execute an action corresponding to a capacitive touch input responsive to sensing the capacitive touch input. For example, the action may include playing or pausing music, answering or disconnecting a phone call, skipping to a next audio track, and so forth.

In at least one example, a capacitive touch sensor includes a capacitor plate and an antenna. The capacitor plate may be coupled to a source of a voltage signal and may act as a powered capacitor plate. The antenna, in addition to radiating and/or receiving electromagnetic signals, may be coupled to a reference node (for example, a ground node to provide a ground reference) and act as a reference voltage capacitor plate. Accordingly, a capacitor may be formed with only a single additional capacitor plate, that is, without adding an additional reference plate. Examples provided herein thus enable a reduction in size and cost of devices, such as audio devices, incorporating a capacitive touch sensor as discussed above.

Audio devices may include various devices, such as headphones or earphones. A headphone or earphone may refer to a device that typically fits around, on, in, or near an ear and that radiates acoustic energy into or towards the ear canal. Headphones and earphones are sometimes referred to as earpieces, headsets, earbuds, or sport headphones, and can be wired or wireless. Certain wireless headphones play audio to a user based on information received from an audio source.

An audio source may include a computing device (for example, a laptop computer, desktop computer, tablet, smartphone, or other electronic device) configured to communicate wireless signals encoding audio information to the wireless headphones. While headphones are described in various examples within this document, the technology described in this document is also applicable to other wearable audio devices. The term "wearable audio device," as used in this document, is intended to mean a device that fits around, on, in, or near an ear (including open-ear audio devices worn on the head or shoulders of a user) and that radiates acoustic energy into or towards the ear. Wearable audio devices include but are not limited to headphones, earphones, earpieces, headsets, earbuds, sport headphones, and audio eyeglasses, and can be wired or wireless. In some examples, a wearable audio device may be an open-ear device that includes an acoustic driver to radiate acoustic energy towards the ear while leaving the ear open to its environment and surroundings. A wireless wearable audio device may be referred to herein as a "wireless audio device."

A headphone may include an electro-acoustic transducer driver to transduce audio signals into acoustic energy. The acoustic driver may be housed in an earcup, earbud, or other housing. Some of the figures and descriptions following show a single headphone device or component, such as an antenna. A headphone may be a single stand-alone unit or one of a pair of headphones (each including at least one acoustic driver), one for each ear. A headphone may be connected mechanically and/or electrically to another headphone, for example by a headband and/or by leads that conduct audio signals to an acoustic driver in the headphone.

A headphone may include components for wirelessly receiving audio signals or other wireless signals. A headphone may include components of an active noise reduction (ANR) system. Headphones may also include other components, such as capacitive touch sensors, antennas, microphones, accelerometers, gyroscopes, infrared sensors, compasses, GPS components, and so forth. A headphone may also be an open-ear device that includes an electro-acoustic transducer to radiate acoustic energy towards the ear canal while leaving the ear open to its environment and surroundings.

Figure 1:
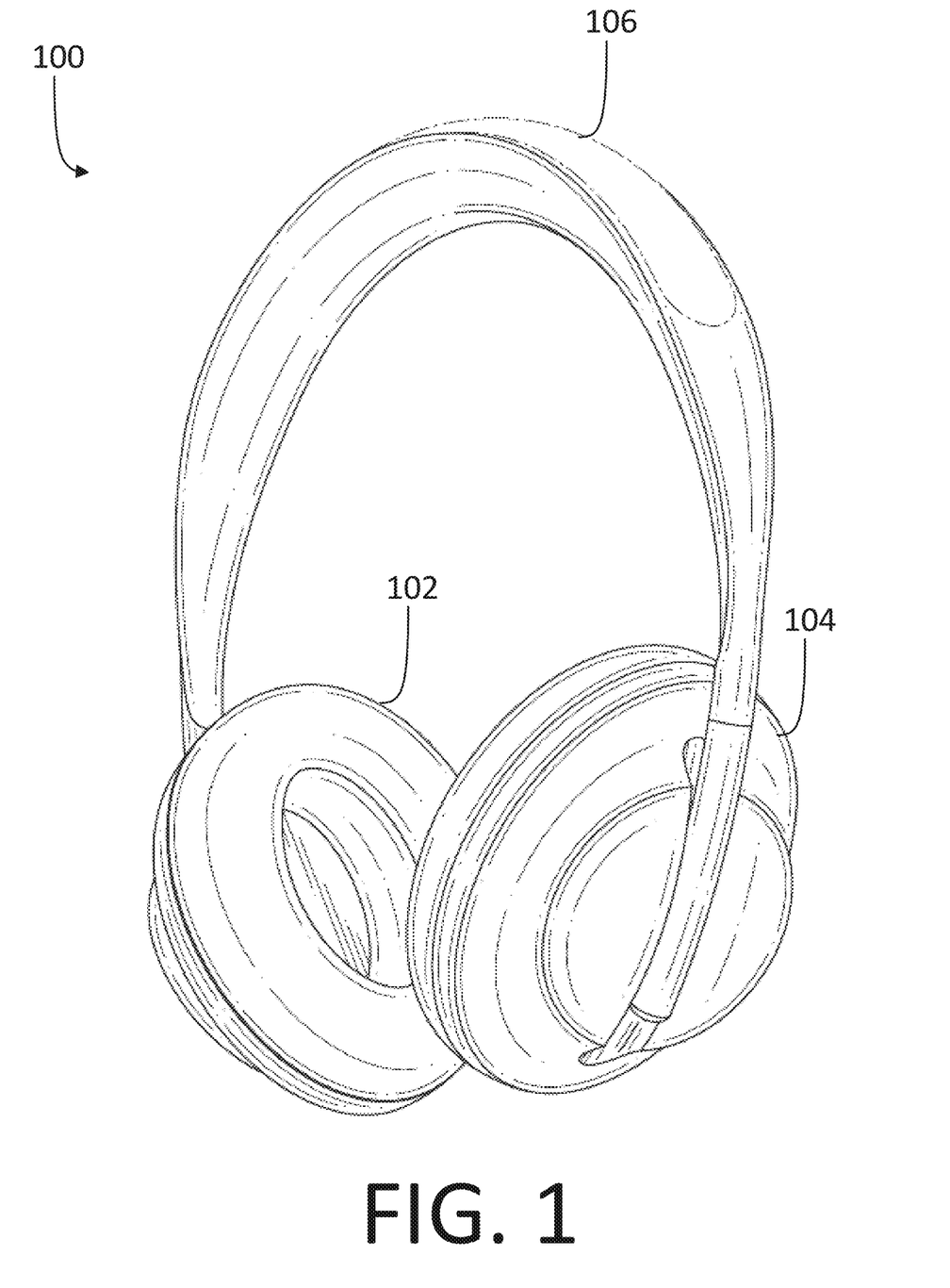
FIG. 1 illustrates a perspective view of headphones according to an example.

Example wireless audio devices will be described with respect to FIGS. 1-3B. However, it is to be appreciated that FIGS. 1-3B illustrate only some examples of audio devices. As discussed above, other audio devices are within the scope of the disclosure. FIG. 1 illustrates a perspective view of headphones 100 according to an example. The headphones 100 include a first housing 102, a second housing 104, and a connector 106. In one example, the first housing 102 may be configured to be placed over one of a user's ears, and the second housing 104 may be configured to be placed over another of the user's ears. The first housing 102 and the second housing 104 may each respectively include an acoustic driver configured to transmit acoustic energy to the user. The connector 106 may provide an electrical and/or mechanical connection between the first housing 102 and the second housing 104 and facilitate coupling of the headphones 100 to the user's ears and/or head.

Figure 2:
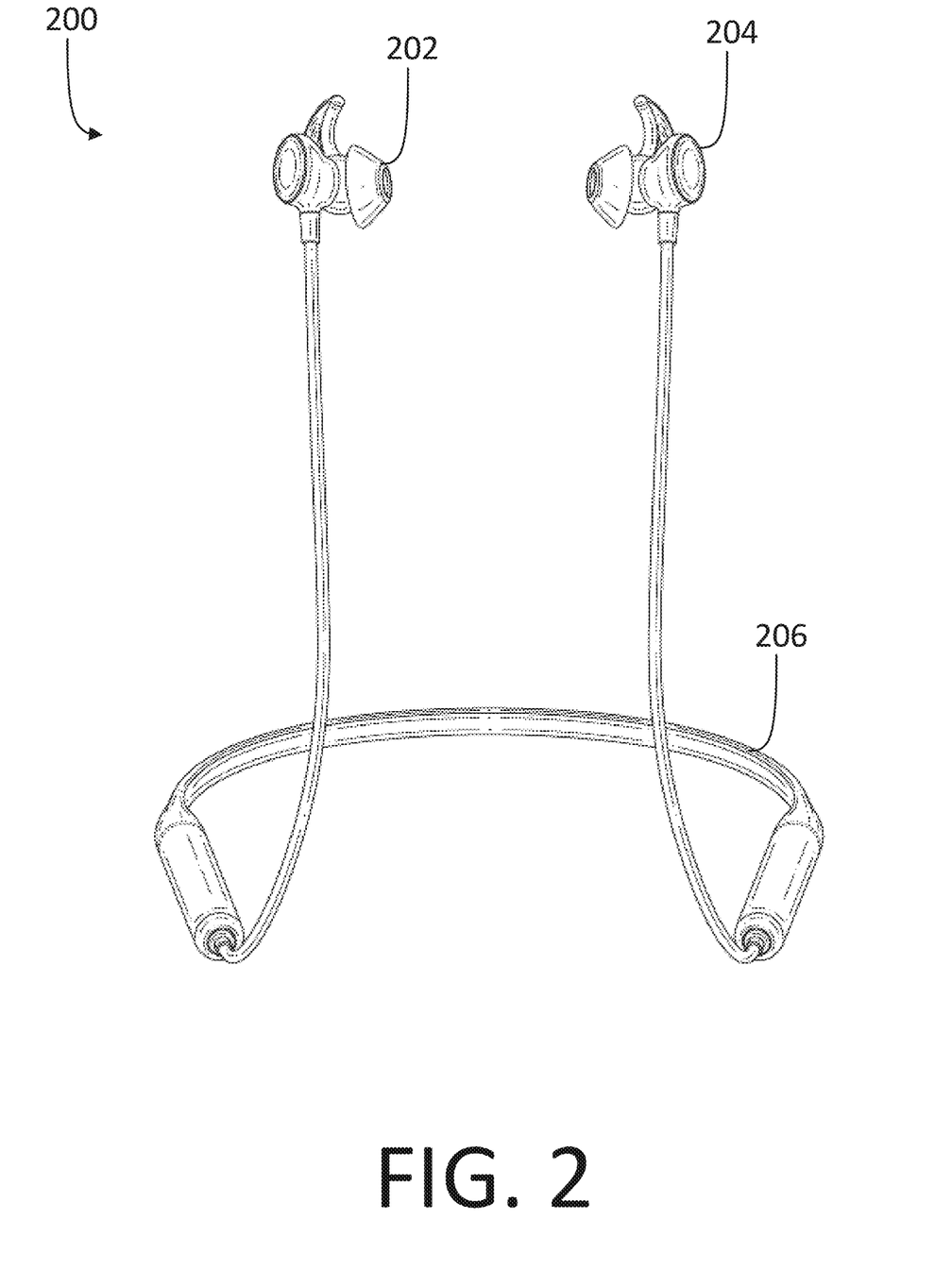
FIG. 2 illustrates a perspective view of headphones according to another example.

FIG. 2 illustrates a perspective view of headphones 200 according to another example. The headphones 200 include a first housing 202, a second housing 204, and a connector 206. In one example, the first housing 202 may be configured to be inserted into one of a user's ear canals or pinne, and the second housing 104 may be configured to be inserted into another of the user's ear canals or pinne. The first housing 202 and the second housing 204 may each respectively include an acoustic driver configured to provide acoustic energy to the user. The connector 206 may provide an electrical and/or mechanical connection between the first housing 202 and the second housing 204. Although the connector 206 may be implemented in a wired configuration, the headphones 200 may be referred to as a wireless audio device in certain examples, such as where the headphones maintain a wireless connection with an audio source.

Figure 3A:
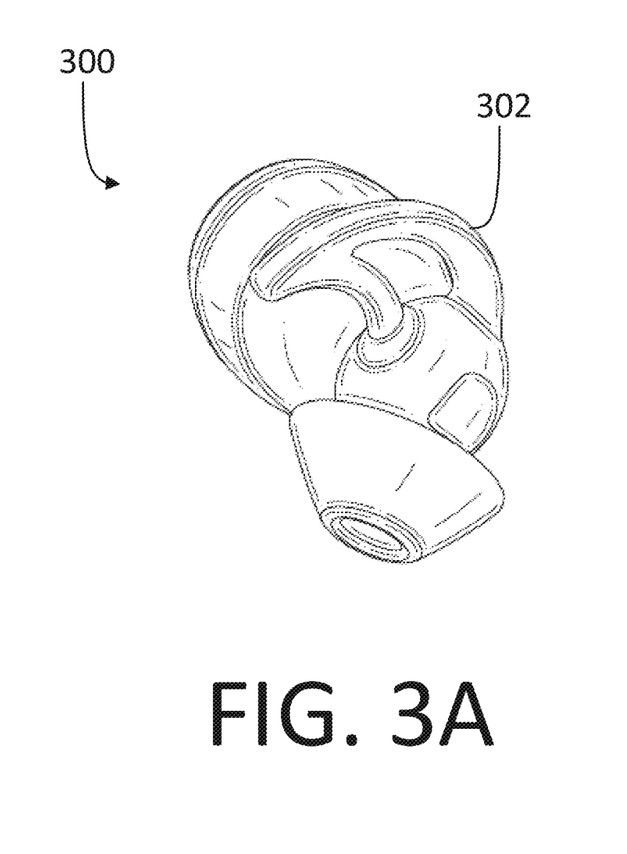
FIG. 3A illustrates a first perspective view of an earpiece according to an example.
Figure 3B:
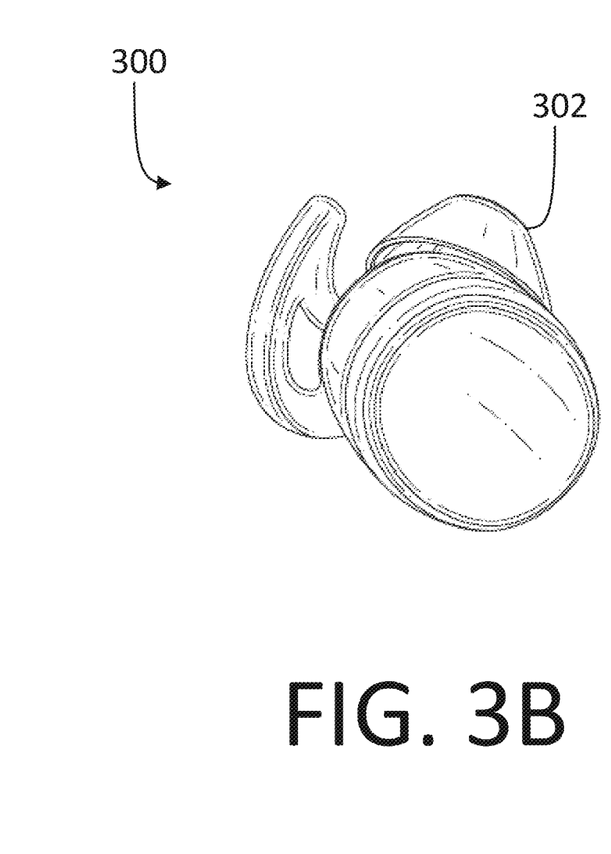
FIG. 3B illustrates a second perspective view of an earpiece according to an example.

FIG. 3A illustrates a perspective view of an earpiece 300 according to another example. FIG. 3B illustrates another perspective view of the earpiece 300 according to an example. The earpiece 300 includes a housing 302. In one example, the housing 302 may be configured to be inserted into one of a user's ear canals or pinne. The housing 302 may include an acoustic driver configured to provide acoustic energy to the user. The earpiece 300 may be implemented in conjunction with another, similar, headphone configured to be inserted into another of the user's ear canals or pinne. In some examples, the earpiece 300 and the similar headphone may communicate wirelessly with one another.

Still other wireless audio devices are contemplated by the disclosure. For example, and as discussed above, wireless audio devices may include, for example, headphones, earphones, earpieces, headsets, earbuds, sport headphones, audio eyeglasses, or other devices configured to output acoustic signals.

Figure 4:
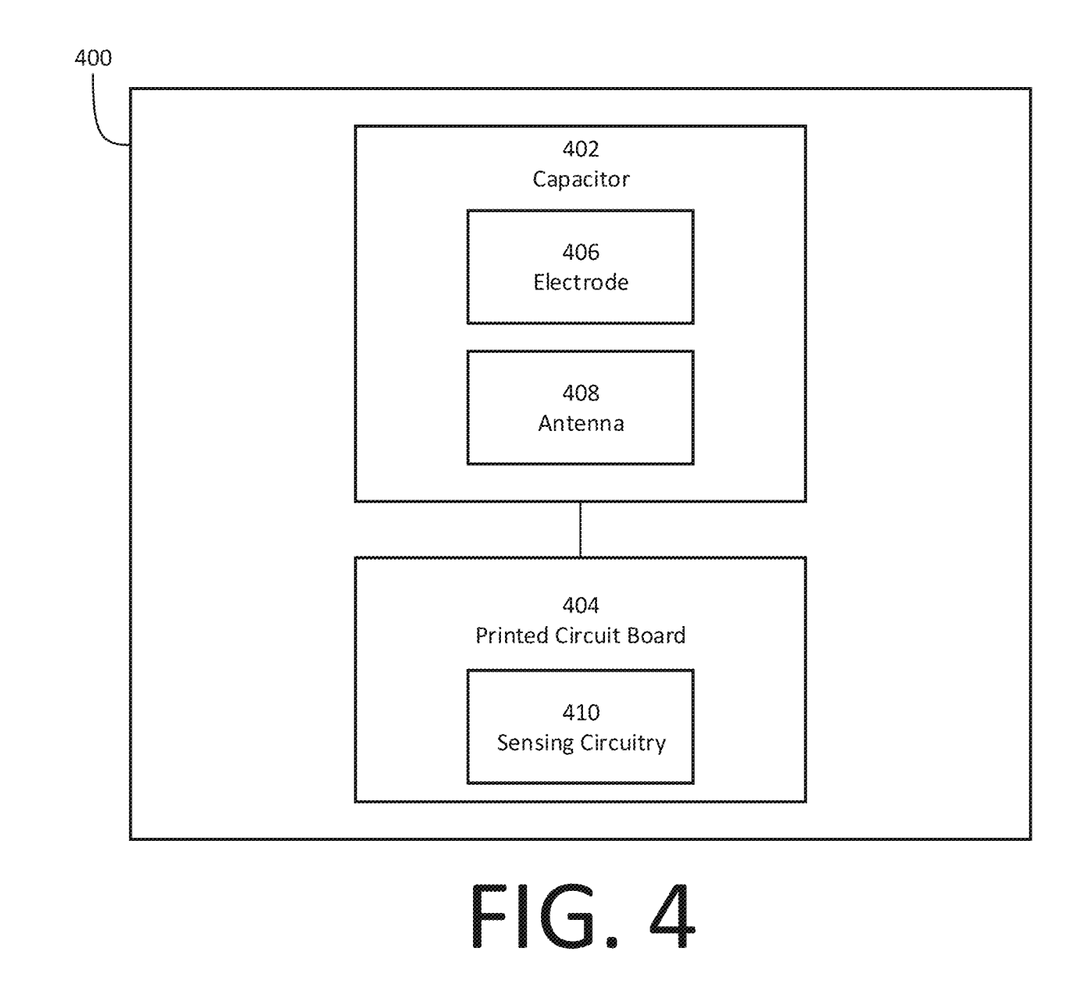
FIG. 4 illustrates a block diagram of an audio device according to an example.

FIG. 4 illustrates a block diagram of an audio device 400 according to an example. The audio device 400 may include, for example, the headphones 100 or 200, the earpiece 300, or a different audio device. The audio device 400 includes a capacitor 402 and a printed circuit board (PCB) 404 electrically coupled to the capacitor 402. The capacitor 402 includes an electrode 406 and an antenna 408. In some examples, the electrode 406 includes multiple electrodes. The PCB 404 includes sensing circuitry 410. As will be appreciated by one of ordinary skill in the art, the audio device 400 may include additional components, such as transducers, energy storage devices, and so forth, which are omitted from FIG. 4 for clarity.

The capacitor 402 is configured to receive a voltage signal from the PCB 404, and generate an electrical field based on the voltage signal. More particularly, the electrode 406 is electrically coupled to the PCB 404 and is configured to receive the voltage signal from the PCB 404. An electrical field is thereby generated between the electrode 406, which is a powered electrode, and the antenna 408, which acts as a ground electrode providing a ground reference.

As discussed above, the electrode 406 may include several electrodes. For example, the electrode 406 may include two powered, mutually capacitive electrodes. Providing multiple mutually capacitive electrodes may advantageously increase a robustness of sensing changes in capacitance, and thereby minimizing false positives. Both of the electrodes 406 may be sensing electrodes being capacitive coupled to each other, and to the antenna 408. That is, responsive to receiving a voltage signal from the PCB 404, a first electrical field is generated between the two electrodes 406, and a second electrical field is generated between the electrodes 406 and the antenna 408. A collective physical footprint of the two electrodes 406 may be substantially similar to a single electrode in examples in which the electrode 406 includes only a single electrode.

The PCB 404 is configured to apply the voltage signal to the electrode 406 to generate the electrical field between the electrode 406 and the antenna 408. In examples in which the electrode 406 includes multiple electrodes, the PCB 404 may apply the voltage signal to the electrodes 406 such that an electrical field is also generated between the electrodes 406. The PCB 404 is further configured to determine a capacitance of the capacitor 402 based on the generated electrical field. More particularly, the PCB 404 is configured to determine the capacitance of the capacitor 402 based on at least one electrical parameter indicative of the capacitance, such as a voltage value of the voltage signal provided to the electrode 406, a current value of a current provided to or received from the electrode 406, and so forth. In various examples, the sensing circuitry 410 is configured to sense the at least one electrical parameter and may include one or more sensing circuits including, for example, a voltage-sensing circuit, a current-sensing circuit, a charge-sensing circuit, or a combination of the foregoing.

The antenna 408 is configured to radiate and receive electromagnetic radiation to and from one or more external entities, such as sources of media content, and to act as a ground electrode in the capacitor 402. In various examples, the antenna 408 may include a monopole antenna. Accordingly, the antenna 408 may be coupled to a reference node, such as a ground node providing a ground reference. The antenna 408 may thus be configured to act as a ground electrode to the electrode 406 in the capacitor 402, thereby obviating the inclusion of an additional electrode configured to perform the dedicated operation of acting as a ground plate to the electrode 406.

The antenna 408 may further be coupled to the PCB 404 via a feed point, to or from which the antenna 408 may provide or receive current signals indicative of (for example, transduced from or to) electromagnetic radiation received from, or to be provided to, one or more external entities. An example of the antenna 408 is provided with respect to U.S. patent application Ser. No. 16/389,240, titled "MULTI-ARM SPIRAL ANTENNA FOR A WIRELESS DEVICE," filed on Apr. 19, 2019, which is incorporated herein by reference in its entirety. In at least one example, the antenna 408 is implemented around a perimeter of the electrode 406. The antenna 408 may be substantially centered on the electrode 406 and symmetrical about the electrode 406 such that a capacitive coupling between the electrode 406 and the antenna 408 is maximized.

Figure 5:
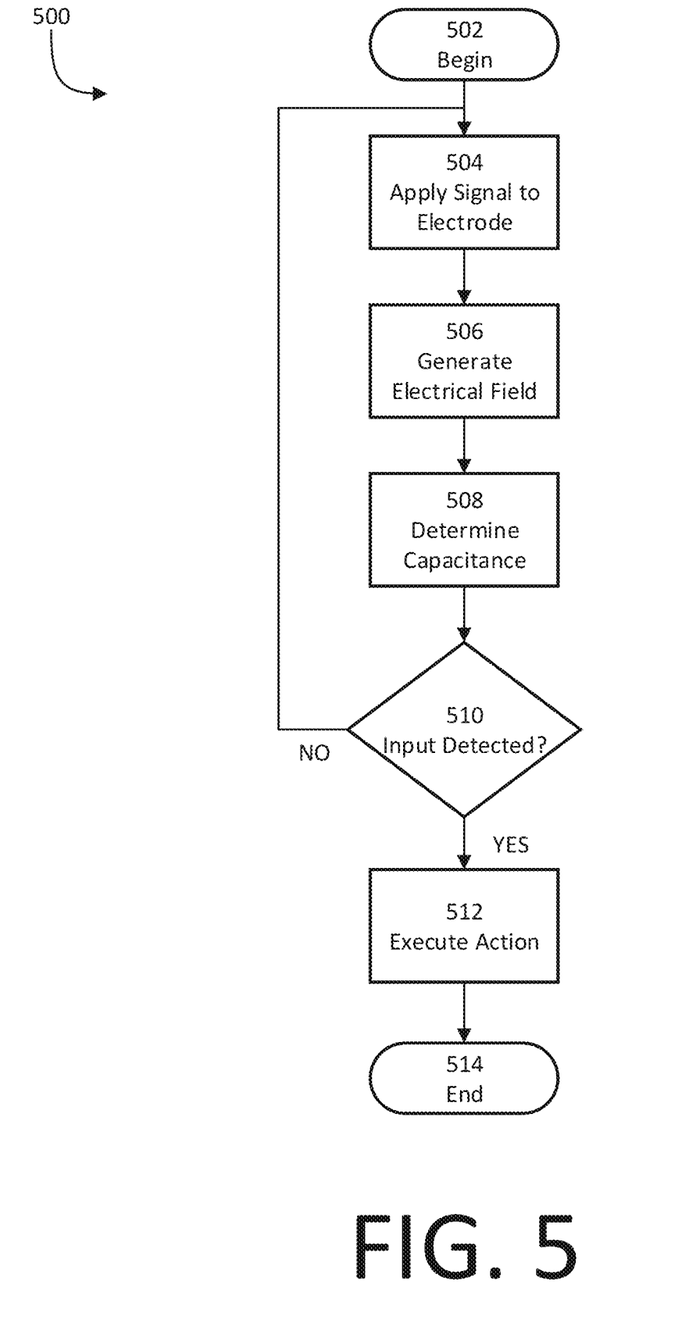
FIG. 5 illustrates a process of controlling an audio device according to an example.

FIG. 5 illustrates a process 500 of operating an audio device according to an example. For example, the process 500 may be executed in connection with the audio device 400. Accordingly, while the process 500 is described in connection with the audio device 400 for purposes of explanation, it is to be appreciated that the process 500 may be executed in connection with audio devices other than the audio device 400. In various examples, the process 500 may be executed during a manufacturer testing phase, during operation (for example, where the audio device is providing, or capable of providing, acoustic signals), and so forth.

At act 502, the process 500 begins.

At act 504, a voltage signal is applied by the PCB 404 to the electrode 406. For example, the voltage signal may be applied to the electrode 406 to charge and maintain the electrode 406 at a particular voltage level.

At act 506, an electrical field is generated in the capacitor 402. The electrical field may be generated between the electrode 406 and the antenna 408. For example, the electrical field may be generated based on the electrode being charged to a particular voltage level other than a voltage level of the antenna 408. As discussed above, the antenna 408 may be coupled to a reference node having a reference voltage, such as a ground node having a ground reference. In examples in which the electrode 406 includes multiple electrodes, the electrical field may also be generated between the electrodes 406.

At act 508, a capacitance of the capacitor 402 is determined. As appreciated by one of ordinary skill in the art, a capacitance may be determined based on one or more electrical parameters, including a voltage across the capacitor 402, a charge stored by the capacitor 402, and so forth. As discussed above, the sensing circuitry 410 may be configured to sense the one or more electrical parameters such that a capacitance may be determined based on the one or more electrical parameters. For example, the PCB 404 may determine the capacitance based on the one or more electrical parameters sensed by the sensing circuitry 410.

At act 510, a determination is made as to whether a touch input has been detected based on the capacitance. Act 510 may be executed by the PCB 404. As appreciated by one of ordinary skill in the art, a capacitance of a capacitor is based on physical properties of the capacitor, including the dielectric constant of a dielectric in an electrical field of the capacitor. Accordingly, the capacitance of the capacitor will change if a user's body part, such as a finger, is moved into a region of space previously occupied by air in which the electrical field is present.

Act 510 thus includes determining if a capacitance differential has been detected and, if so, whether the capacitance differential corresponds to a user input. For example, the PCB 404 may be calibrated to identify a capacitance differential or value that corresponds to a touch input. If the PCB 404 determines that an input has not been detected (510 NO), then the process 500 returns to act 504. Acts 504-510 are thereafter repeated until a determination is made that an input has been detected (510 YES), at which point the process 500 continues to act 512.

At act 512, an action corresponding to a detected capacitive touch input is executed. For example, the action may be to play or pause music, to answer or disconnect a phone call, to skip an audio track, and so forth. An action corresponding to the detected capacitive touch input may be configurable by a user in various examples.

At act 514, the process 500 ends.

Accordingly, the process 500 enables the audio device 400 to detect and act on capacitive touch inputs provided to the capacitor 402. The audio device 400 is able to do so while simultaneously sending and/or receiving electromagnetic signals to and/or from one or more external entities, such as audio sources, via the antenna 408. Accordingly, examples discussed above enable reductions in cost and size of the audio device 400 by providing a device having an antenna capable of acting as both a reference electrode in a capacitor and sending and/or receiving electromagnetic radiation.

Figure 6A:
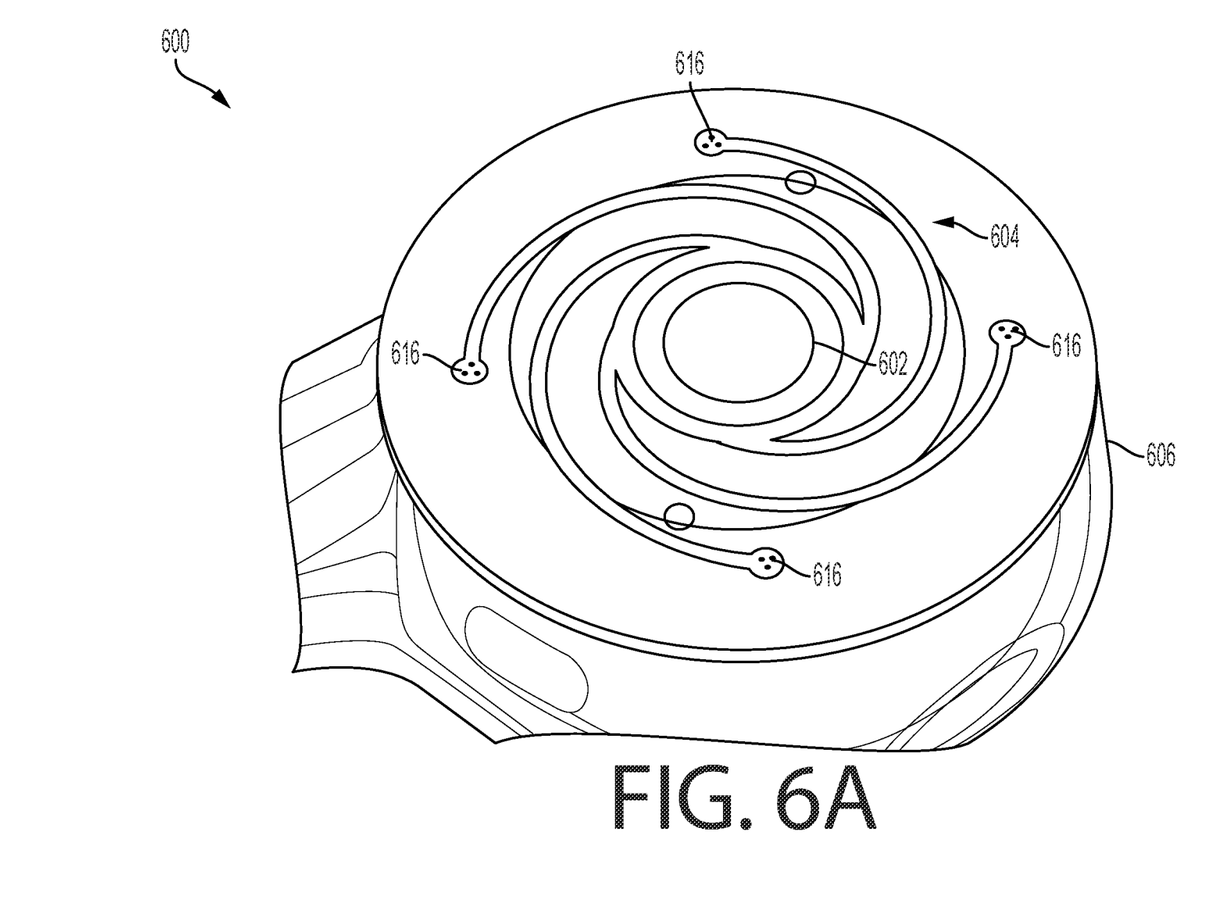
FIG. 6A illustrates a perspective view of an audio device according to an example.
Figure 6B:
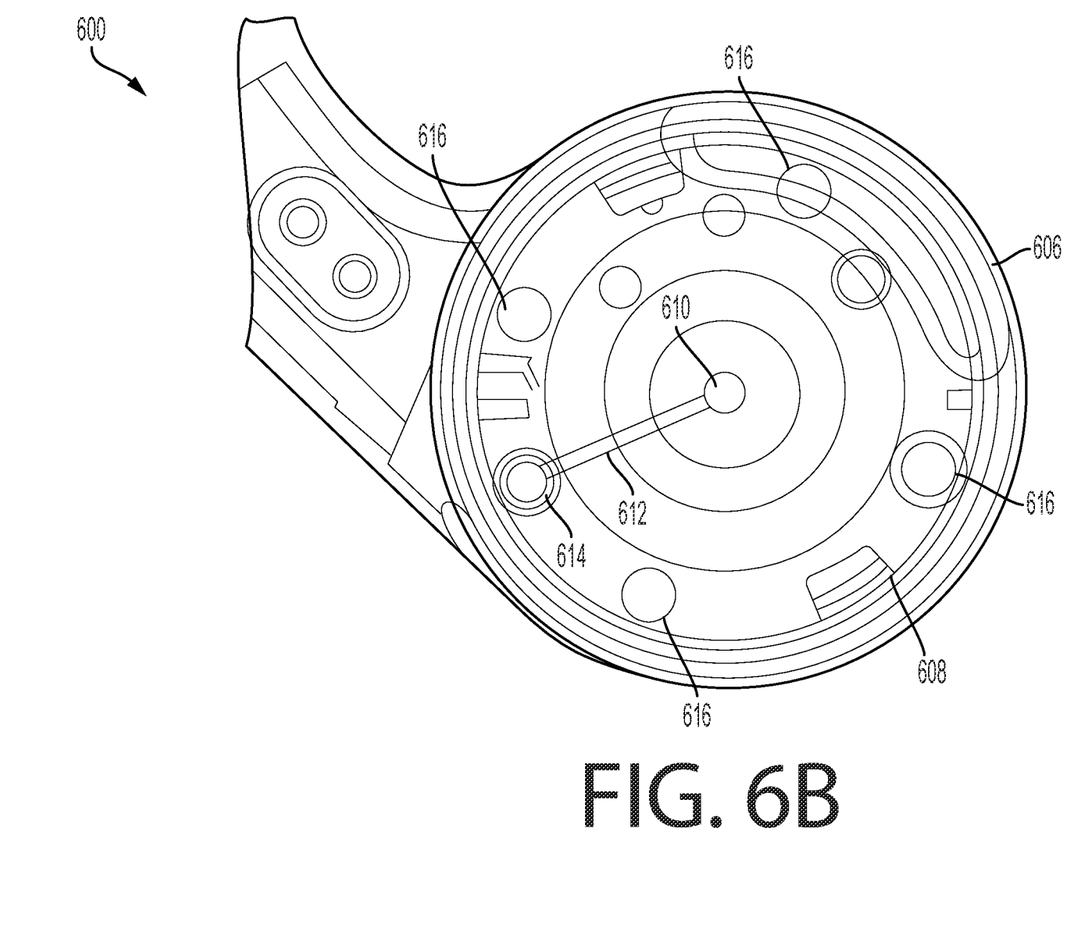
FIG. 6B illustrates a cutaway bottom view of the audio device according to an example.

FIG. 6A illustrates a perspective view of an audio device 600 according to an example. FIG. 6B illustrates a bottom view of the audio device 600 according to an example. The audio device 600 may be an example of the audio device 400, discussed above. The audio device 600 includes an electrode 602, an antenna 604, an enclosure 606, a PCB 608, a via 610, a trace 612, and a pogo pin 614. The antenna 604 includes connectors 616.

The electrode 602 is physically coupled to the enclosure 606, is electrically coupled to the PCB 608 through the via 610, the trace 612, and the pogo pin 614, and is capacitively coupled to the antenna 604. The electrode 602 may include a conductive material, and may be formed using one of several techniques. For example, the electrode 602 may be formed in an outer surface of the enclosure 606 using a laser-direct structuring (LDS) technique. In other examples, other techniques may be used to form the electrode 602. As discussed in greater detail below, the electrode 602 is configured to receive a voltage signal from the PCB 608 through the via 610, the trace 612, and the pogo pin 614, and generate an electric field between the electrode 602 and the capacitively coupled antenna 604.

The antenna 604 is physically coupled to the enclosure 606, is electrically coupled to the PCB 608 through the connectors 616, is capacitively coupled to the antenna 604, and is communicatively coupled to one or more external entities. The antenna 604 may include a conductive material, and may be formed using one of several techniques. For example, the antenna 604 may be formed in an outer surface of the enclosure 606 using an LDS technique, or another antenna-forming technique. The antenna 604 is configured to provide and/or receive one or more current signals to and/or from the PCB 608, transduce the one or more current signals to and/or from one or more electromagnetic signals, and provide and/or receive the one or more electromagnetic signals to and/or from the one or more external entities. An example of the antenna 604 is provided with respect to U.S. patent application Ser. No. 16/389,240, titled "MULTI-ARM SPIRAL ANTENNA FOR A WIRELESS DEVICE," filed on Apr. 19, 2019.

As discussed in greater detail below, the antenna 604 is configured to be capacitively coupled to the electrode 602 at least in part by acting as a reference node (for example, a ground node). One or more (for example, three) of the connectors 616 may be coupled to a ground plane within the enclosure 606, and one or more remaining (for example, one) connectors of the connectors 616 may be coupled to a feed point through which one or more current signals are sent and/or received with respect to the PCB 608. At least because the antenna 604 may be coupled to the ground plane via the connectors 616, the antenna 604 may behave as a ground electrode with respect to the electrode 602, such that a capacitor is formed with the electrode 602 and the antenna 604 responsive to the electrode 602 receiving the voltage signal from the PCB 608, as discussed above.

The enclosure 606 is physically coupled to the electrode 602 and the antenna 604, and encloses the PCB 608, the via 610, the trace 612, and the pogo pin 614. In various examples, the enclosure 606 may include a plastic material. For example, where the electrode 602 and the antenna 604 are formed using LDS techniques, the electrode 602 may include a material compliant with LDS techniques.

The PCB 608 is electrically coupled to the electrode 602 through the via 610, the trace 612, and the pogo pin 614, and is electrically coupled to the antenna 604. The PCB 608 is configured to apply a voltage signal to the electrode 602 to generate an electrical field between the electrode 602 and the antenna 604. The PCB 608 is further configured to determine one or more electrical parameters of the electrode 602 indicative of a capacitance between the electrode 602 and the antenna 604. For example, the PCB 608 may include sensing circuitry, similar to the sensing circuitry 410 and which may include a sensing integrated circuit (IC), configured to sense the one or more electrical parameters from which the PCB 608 may detect a differential capacitance.

The PCB 608 may be electrically coupled to the antenna 604 via one or more of the connectors 616. For example, the PCB 608 may be coupled to the antenna 604 via one or more of the connectors 616 acting as a feed point through which the PCB 608 may send and/or receive electromagnetic signals to and/or from the antenna 604. The PCB 608 may further be coupled to one or more ground planes, such as a ground plane to which the antenna 604 is coupled via one or more of the connectors 616.

The via 610 is formed through the enclosure 606, and is electrically coupled to the electrode 602 at a first end and to the trace 612 at a second end. The via 610 may extend fully through the enclosure 606 from a first surface of the enclosure 606 (for example, an outer surface on which the electrode 602 is formed) to a second surface of the enclosure 606 (for example, an inner surface on which the trace 612 is formed, as discussed below). Accordingly, the via 610 electrically couples the electrode 602 to the trace 612 such that signals may be exchanged through the via 610. In some examples, the via 610 may include, or be replaced by, several vias.

The trace 612 is formed on or in the enclosure 606, and is electrically coupled to the via 610 at a first end and to the pogo pin 614 at a second end. The trace 612 may be formed on the second surface of the enclosure 606 (for example, the inner surface of the enclosure 606), and electrically coupled the via 610 to the pogo pin 614 such that signals may be exchanged through the trace 612.

The pogo pin 614 is electrically coupled to the trace 612 at a first end and to the PCB 608 at a second end. As appreciated by one of ordinary skill in the art, the pogo pin 614 may operate under a restoring force such that the first end forms an electrical connection with the trace 612 and the second end forms an electrical connection with the PCB 608. Accordingly, the combination of the via 610, the trace 612, and the pogo pin 614 forms a conductive path between the electrode 602 and the PCB 608.

To illustrate the foregoing principles in greater depth, an example of the process 500 is provided with respect to the audio device 600.

At act 502, the process 500 begins.

At act 504, a voltage signal is applied by the PCB 608 to the electrode 602. For example, the PCB 608 may apply the voltage signal to the electrode 602 through the pogo pin 614, the trace 612, and the via 610.

At act 506, an electrical field is generated between the electrode 602 and the antenna 604. For example, the electrical field may be generated based on the voltage signal applied to the electrode 602 from the PCB 608. As discussed above, the antenna 604 may act as a reference electrode at least in part because of the connection of the antenna 604 to the reference plane via one or more of the connectors 616, such that the antenna 604 is capacitively coupled to the electrode 602.

At act 508, a determination is made as to a capacitance between the electrode 602 and the antenna 604 generated based on the electrical field. As discussed above, determining the capacitance may include determining one or more electrical parameters indicative of the capacitance, such as a voltage across the capacitor formed by the electrode 602 and the antenna 604, a charge of the capacitor, and so forth. For example, the PCB 608 may include sensing circuitry and/or a sensing IC configured to sense the one or more electrical parameters. The PCB 608 may subsequently determine, based on the sensed one or more electrical parameters, a capacitance between the electrode 602 and the antenna 604.

At act 510, a determination is made as to whether a capacitive touch input has been detected. As discussed above, a capacitance of a capacitor formed by the electrode 602 and the antenna 604 may differ based on the proximity of a user's finger (or other body part) to the electrode 602, such that the presence or absence of the user's finger may be determined based on the capacitance determined at act 508. If no capacitive touch input is detected (510 NO), then the process 500 returns to act 504. Otherwise, if a capacitive touch input is detected (510 YES), then the process 500 continues to act 512.

At act 512, an action corresponding to the capacitive touch input is executed according to a type of the capacitive touch input. For example, the audio device 600 may play or pause music output by the audio device 600, or may perform another action mapped to the capacitive touch input. Executing an action may include communicating, via the antenna 604, one or more signals to one or more external devices. For example, where an action includes pausing music, the audio device 600 may communicate one or more signals to an audio source device providing audio signals to the audio device 600 to request that the audio source device discontinue providing the audio signals to the audio device 600. In various examples, the audio device 600 may discern between various types of capacitive touch inputs. For example, a first action may be mapped to a "tap" capacitive touch input, a second action may be mapped to a "long press" capacitive touch input, a third action may be mapped to a "double tap" capacitive touch input, and so forth.

At act 514, the process 500 ends.

Figure 7:
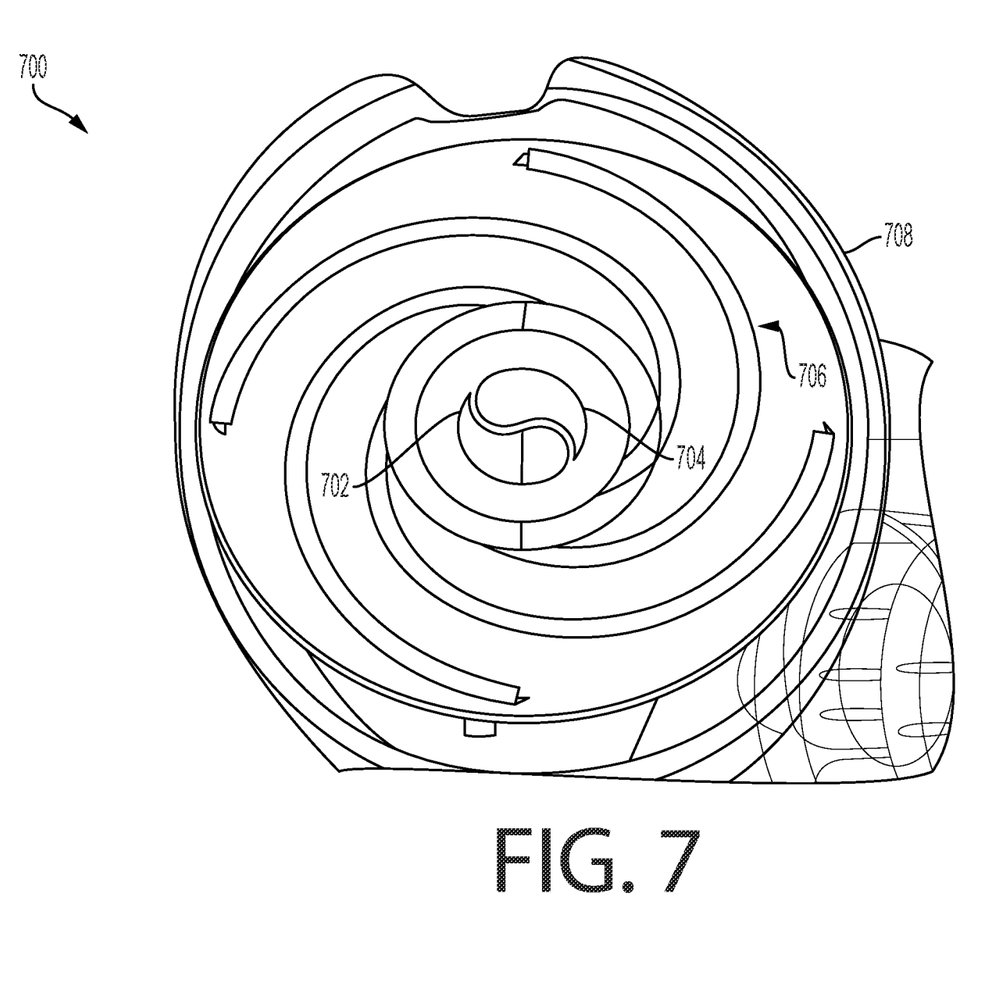
FIG. 7 illustrates a top view of an audio device according to an example.

FIG. 7 illustrates a top view of an audio device 700 according to another example. The audio device 700 may be an example of the audio device 400, discussed above. The audio device 700 includes a first electrode 702, a second electrode 704, an antenna 706, and an enclosure 708. In some examples, the audio device 700 is substantially identical to the audio device 600, with an exception in the structure of the electrode 602 as compared to the electrodes 702 and 704.

The first electrode 702 and the second electrode 704 are both powered electrodes, mutually capacitively coupled to one another. In some examples, the electrodes 702, 704 are arranged roughly in a yin and yang topology, which may increase a mutual capacitance between the electrodes 702, 704. In other examples, the electrodes 702, 704 may be arranged in an alternate topology, such as two semi-circles. As illustrated in FIG. 7, the physical footprint of the electrodes 702 and 704 collectively may be substantially similar to the physical footprint of the electrode 602, with the exception of the gap between the electrodes 702, 704.

Accordingly, examples have been provided in which a capacitance between an electrode and an antenna is capable of being generated and detected. In various examples, a differential capacitance may also be generated and detected between two powered electrodes. Although particular examples have been provided for purposes of clarity, is it to be appreciated that various modifications to the examples discussed above may be implemented. For example, although the antenna 604 is illustrated as a multi-arm spiral antenna, in other examples, the antenna 604 may be implemented in a different configuration (for example, having more or fewer arms, having arms arranged in a pattern other than an Archimedean spiral, and so forth). In various examples, the antenna 604 may advantageously have a symmetrical configuration about the electrode 602, which is surrounded by the antenna 604. Similarly, it is to be appreciated that the size, shape, and position of the electrode 602 may be modified in alternate examples.

Furthermore, while certain examples have been provided in which the electrode 602 and the antenna 604 are formed using an LDS technique, in other examples, either or both of the electrode 602 and the antenna 604 may be formed using alternative techniques, such as by using a conventional PCB. Similar principles apply to the electrodes 702, 704 and the antenna 606. Although examples have been provided in which the electrode 602 is coupled to the PCB 608 through certain electrical connectors (including, for example, the via 610, the trace 612, and the pogo pin 614), alternate, additional, and/or fewer components may be implemented to supplement or supplant the example electrical connectors.

Having thus described several aspects of at least one example, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:
1. A device comprising:
   an antenna;
   a capacitor including:
      a first plate having a first voltage; and
      the antenna having a second voltage;
   sensing circuitry coupled to the first plate and configured to:
      apply the first voltage to the first plate;
      determine a capacitance between the first plate and the antenna; and
      identify, based on the capacitance, a capacitive touch input; and
   an enclosure having an outer surface and an inner surface and including the sensing circuitry, wherein the first plate and the antenna are formed on the outer surface of the enclosure.

2. The device of claim 1, wherein the second voltage is a ground reference.

3. The device of claim 1, wherein the capacitor consists of the first plate and the antenna.

4. The device of claim 1, wherein the antenna is implemented around a perimeter of the first plate.

5. The device of claim 4, wherein the antenna is substantially symmetrical around the first plate.

6. The device of claim 1, wherein the first plate is coupled to the inner surface of the enclosure by at least one via through the enclosure.

7. The device of claim 6, wherein the at least one via is coupled to the sensing circuitry by a trace on the inner surface of the enclosure.

8. The device of claim 7, wherein the sensing circuitry includes a printed circuit board (PCB), and wherein the trace is coupled to the PCB by a pogo pin between the trace and the PCB.

9. The device of claim 1, wherein the sensing circuitry is further configured to sense at least one of the first voltage and a current applied to the first plate, and wherein determining, by the sensing circuitry, the capacitance between the first plate and the antenna is based on the at least one of the first voltage and the current applied to the first plate.

10. The device of claim 1, wherein the capacitor further includes a second plate having a third voltage, and wherein the sensing circuitry is further configured to:
   apply the third voltage to the second plate;
   determine a change in a mutual capacitance between the first plate and the second plate; and
   identify, based on the change in the mutual capacitance, the capacitive touch input.

11. A method of operating a device including sensing circuitry, an antenna, and a capacitor including a first plate and the antenna, the method comprising:
   applying, by the sensing circuitry, a first voltage to the first plate;
   generating an electrical field between the first plate and the antenna based on the first voltage, the first plate and the antenna being formed on an outer surface of an enclosure having an inner surface and the outer surface and including the sensing circuitry;
   determining at least one electrical parameter indicative of a capacitance between the first plate and the antenna based on the electrical field; and
   identifying, based on the at least one electrical parameter, a capacitive touch input.

12. The method of claim 11, wherein determining the at least one electrical parameter includes sensing at least one of the first voltage and a current applied to the first plate.

13. The method of claim 12, further comprising determining, based on the at least one electrical parameter, the capacitance between the first plate and the antenna, wherein identifying the capacitive touch input includes detecting a change in the capacitance between the first plate and the antenna.

14. The method of claim 11, wherein the capacitor further includes a second plate, the method further comprising:
   applying a second voltage to the second plate;
   generating an electrical field between the first plate and the second plate based on the second voltage;

determining at least one electrical parameter indicative of a change in a mutual capacitance between the first plate and the second plate based on the electrical field; and identifying, based on the at least one electrical parameter indicative of the change in the mutual capacitance, the capacitive touch input.

15. The method of claim 11, wherein identifying the capacitive touch input includes detecting a change in the at least one electrical parameter indicative of a change in the capacitance between the first plate and the antenna.

16. A non-transitory computer-readable medium storing thereon sequences of computer-executable instructions for operating a device including sensing circuitry, an antenna, and a capacitor comprising a first plate and an antenna, the sequences of computer-executable instructions including instructions that instruct at least one processor to:

apply, using the sensing circuitry, a first voltage to the first plate;

generate an electrical field between the first plate and the antenna based on the first voltage, the first plate and the antenna being formed on an outer surface of an enclosure having an inner surface and the outer surface and including the sensing circuitry;

determine at least one electrical parameter indicative of a capacitance between the first plate and the antenna based on the electrical field; and identify, based on the at least one electrical parameter, a capacitive touch input.

17. The non-transitory computer-readable medium of claim 16, wherein determining the at least one electrical parameter includes sensing at least one of the first voltage and a current applied to the first plate, and wherein the instructions further instruct the at least one processor to determine, based on the at least one electrical parameter, the capacitance between the first plate and the antenna.

18. The non-transitory computer-readable medium of claim 17, wherein identifying the capacitive touch input includes at least one of detecting a change in the capacitance between the first plate and the antenna and detecting a change in the at least one electrical parameter indicative of a change in the capacitance between the first plate and the antenna.

19. The non-transitory computer-readable medium of claim 16, wherein the device further includes a second plate, and wherein the instructions further instruct the at least one processor to:

apply a second voltage to the second plate;

generate an electrical field between the first plate and the second plate based on the second voltage;

determine at least one electrical parameter indicative of a change in a mutual capacitance between the first plate and the second plate based on the electrical field; and identify, based on the at least one electrical parameter indicative of the change in the mutual capacitance, the capacitive touch input.

* * * * *